United States Patent
Antolovic et al.

(10) Patent No.: US 12,192,656 B2
(45) Date of Patent: Jan. 7, 2025

(54) LOW-POWER IMAGE SENSOR SYSTEM WITH SINGLE-PHOTON AVALANCHE DIODE PHOTODETECTORS

(71) Applicant: ECOLE POLYTECHNIQUE FEDERALE DE LAUSANNE (EPFL), Lausanne (CH)

(72) Inventors: Ivan Michel Antolovic, Lausanne (CH); Claudio Bruschini, Villars-sous-Yens (CH); Edoardo Charbon, Jouxtens-Mezery (CH)

(73) Assignee: Ecole Polytechnique Federale De Lausanne, Lausanne (CH)

( * ) Notice: Subject to any disclaimer, the term of this patent is extended or adjusted under 35 U.S.C. 154(b) by 272 days.

(21) Appl. No.: 17/631,303

(22) PCT Filed: Aug. 1, 2019

(86) PCT No.: PCT/EP2019/070797
§ 371 (c)(1),
(2) Date: Jan. 28, 2022

(87) PCT Pub. No.: WO2021/018403
PCT Pub. Date: Feb. 4, 2021

(65) Prior Publication Data
US 2022/0264047 A1    Aug. 18, 2022

(51) Int. Cl.
*H04N 25/77*    (2023.01)
*H01L 27/146*    (2006.01)
(Continued)

(52) U.S. Cl.
CPC ....... *H04N 25/77* (2023.01); *H01L 27/14643* (2013.01); *H01L 31/107* (2013.01); *H04N 25/571* (2023.01)

(58) Field of Classification Search
CPC .... H04N 25/77; H04N 25/571; H04N 25/772; H01L 27/14643; H01L 31/107; G01T 1/171
See application file for complete search history.

(56) References Cited

U.S. PATENT DOCUMENTS 8,633,996 B2    1/2014    Charbon
9,210,350 B2    12/2015   Dai
(Continued)

FOREIGN PATENT DOCUMENTS

CN    107449516 A    12/2017

OTHER PUBLICATIONS

International Search Report & Written Opinion mailed Dec. 16, 2019, in international patent application No. PCT/EP2019/070797, 9 pages.

(Continued)

*Primary Examiner* — Mekonnen D Dagnew
(74) *Attorney, Agent, or Firm* — Blueshift IP; Robert Plotkin

(57) ABSTRACT

The invention relates to an image sensor comprising a photodetector array including neighboring photodetector elements, each photodetector element comprising: —a photodetector cell having a photodiode and a reset unit; —a cell control unit coupled with the photodetector cell and configured to reset the photodiode by means of the reset unit; wherein the cell control unit is configured to asynchronously effect resetting of the photodiode after a given dead time after detection of a photon.

20 Claims, 6 Drawing Sheets

(51) Int. Cl.
    *H01L 31/107*     (2006.01)
    *H04N 25/571*     (2023.01)

(56) References Cited

U.S. PATENT DOCUMENTS

| | | | |
|---|---|---|---|
| 9,596,421 B1* | 3/2017 | Itzler | H04N 25/00 |
| 2001/0020863 A1* | 9/2001 | Cova | G01J 1/44 |
| | | | 327/514 |
| 2019/0056497 A1* | 2/2019 | Pacala | G01S 7/4816 |
| 2019/0113385 A1 | 4/2019 | Fukuchi | |
| 2019/0219443 A1* | 7/2019 | Fujimoto | G01J 1/44 |

OTHER PUBLICATIONS

E. R. Fossum, "Modeling the Performance of Single-Bit and Multi-Bit Quanta Image Sensors," IEEE J. Electron Devices Soc., vol. 1, No. 9, pp. 166-174, Sep. 2013.

T. Al Abbas et al., "Backside illuminated SPAD image sensor with 7.83μm pitch in 3D-stacked CMOS technology," in 2016 IEEE International Electron Devices Meeting (IEDM), 2016, p. 8.1.1-8.1.4.

\* cited by examiner

LOW-POWER IMAGE SENSOR SYSTEM WITH SINGLE-PHOTON AVALANCHE DIODE PHOTODETECTORS

TECHNICAL FIELD

The present invention relates to photodetectors, and particularly to imaging systems with reduced power consumption and an improved dynamic range.

TECHNICAL BACKGROUND

Usually, image sensors include a two-dimensional array of photodetectors. Photodetectors are configured to detect one to multiple impinging photons and provide a corresponding photon detection signal to generate image information of a received light distribution. One kind of photodetector includes a single-photon avalanche diode (SPAD) which is configured to detect light and amplify an electron-hole pair through an electrical field which produces a detectable avalanche of electrons upon photodetection.

Such SPAD photodetection cells are usually fabricated in a silicon substrate having a p-n -junction biased beyond its breakdown voltage such that each electron-hole pair can trigger an avalanche multiplication process forming a photon detection signal as an electrical pulse signal.

After recognizing such an avalanche, the avalanche is quenched by reducing the electrical field which accelerates the generated electrons so that the avalanche process is stopped. Thereafter, the electrical field is increased again. After a dead time, which corresponds to the time from photon detection to the time when the electrical field has been re-established, the SPAD is ready for a next photon detection. The dead time before re-establishing the electrical field is commonly set as low as possible to increase maximum counting rate and achieve a Poisson-limited signal-to-noise ratio.

Document U.S. Pat. No. 9,210,350 discloses an imaging system, comprising a pixel array including a plurality of pixels, wherein each one of the plurality of pixels includes a single photon avalanche diode (SPAD) coupled to detect photons in response to incident light. A plurality of photon counters is included in a readout circuitry, wherein each one of the plurality of photon counters is coupled to a respective one of the plurality of pixels to count a number of photons detected by said respective one of the plurality of pixels. Each one of the plurality of photon counters is coupled to stop counting photons for said respective one of the plurality of pixels that reaches a threshold photon count, and wherein each one of the plurality of photon counters is coupled to continue counting photons for said respective one of the plurality of pixels that does not reach the threshold photon count. A control circuitry is coupled to the pixel array to control operation of the pixel array and includes an exposure time counter coupled to count an exposure time elapsed before each one of the plurality of pixels detects the threshold photon count. Respective exposure time counts and photon counts are combined for each one of the plurality of pixels of the pixel array.

Document U.S. Pat. No. 8,633,996 B2 discloses an image sensor comprising a plurality of micro-lenses arranged in rows and columns; and a light-sensitive semiconductor region disposed adjacent the micro-lenses without additional lensing therebetween and having a plurality of sub-regions arranged in rows and columns that correspond to the rows and columns of the micro-lenses, each of the sub-regions having a plurality of uniformly sized light-sensitive elements disposed to receive light collected by a respective one of the micro-lenses and that generate respective signal levels in correspondence with sensing respective numbers of photons.

Further, also Document E. R. Fossum, "Modeling the Performance of Single-Bit and Multi-Bit Quanta Image Sensors," IEEE J. Electron Devices Soc., vol. 1, no. 9, pp. 166-174, September 2013 discloses an imaging system with a global, clock-driven resetting/recharging of the pixel and nonlinear response. The imaging system uses temporal and spatial oversampling of 1-bit pixels to create a nonlinear response.

Document T. Al Abbas et al., "Backside illuminated SPAD image sensor with 7.83 µm pitch in 3D-stacked CMOS technology," in 2016 IEEE International Electron Devices Meeting (IEDM), 2016, p. 8.1.1-8.1.4 discloses an SPAD image sensor with passive quenching and recharge (Rser constant) and a minimized dead time, operated in the linear response regime.

It is the main objective of this invention to introduce a low-power image sensor architecture with increased signal-to-noise ratio over an extended dynamic range.

SUMMARY OF THE INVENTION

According to the invention, an image sensor according to claim 1 and a method for operating an image sensor according to the further independent claim is provided.

Further embodiments are indicated in the depending subclaims.

According to a first aspect, an image sensor is provided comprising a photodetector array including neighboring photodetector elements, each photodetector element comprising:
  a photodetector cell having a photodiode and a reset unit;
  a cell control unit coupled with the photodetector cell and configured to reset the photodiode by means of the reset unit;
  wherein the cell control unit is configured to asynchronously effect resetting of the photodiode after a given dead time after detection of a photon.

Particularly, the photodiode may comprise an avalanche photodiode, such as a single-photon avalanche diode. The resetting of the avalanche photodiode may be performed by recharging an electrical field in the photodiode.

While for conventional image sensors the photodetector elements in the photodetector array are synchronously reset/activated to prepare for photon detection, the above image sensor is operated in an asynchronous manner. Asynchronous operation of a photodetector element is performed by resetting, e.g. by quenching and recharging in case of a single-photon avalanche diode, after/triggered by a photon detection event with a delay of a given dead time. The photodiode is recharged to re-establish the electrical field after the predetermined dead time so that the photodetector element is reset and ready for detecting further incident photons. During the dead time (i.e. before lapse of the dead time after a photon detection event) the photodiode is unable to detect photons as the biasing of the photodiode is lower than needed for pulsed or Geiger-mode photon detection.

In conventional image sensor systems resetting of the photodetector cells is performed synchronously and independent from the occurrence of a detection event in one or more of the photodetectors. Charges caused by photon detection event are accumulated for each photodetector cell during a frame time which is then read out by a post-processing unit for all the photodetectors of the photodetector array and analog to digital converted to obtain a light intensity indication.

In addition to the asynchronous recharging of the photodetector cells, a counter unit may be provided in each photodetector element and configured to count all detected photon detection events in the photodiode during a given frame time. Within the frame time, a number of photon detection events may occur, thereby giving an indication about the light intensity per pixel (pixel intensity).

Different from state of the art image sensors, due to the cell-related counter unit the image sensor of the present invention allows to directly provide the digital pixel intensity by each of the photodetector cells of the photodetector array. Thus, the pixel intensity does not need to be determined by column-based analog to digital conversion.

The new architecture of the image sensor allows for a high dynamic range, in particular if the maximum detection rate is high and the noise floor indicated by the dark count rate is low. The image sensor can be read out at a very high speed, as the cell counter units are digital. The power consumption and the output data rate are substantially decreased by reducing the pixel activity by increasing the dead time and forcing the operation of the photodetector elements to be into the nonlinearity regime for a broader operation range (broader range of light intensities), while the signal-to-noise ratio is not substantially degraded compared to conventional image sensors.

Basically, the power consumption of an (pulsed photon-counting) image sensor is mainly caused by pixel switching and data rate due to the high dynamic range of the photon detection. By forcing the image sensor to work in a nonlinear regime by increasing the dead time of the asynchronous recharge, a data compression is performed pixel-wise, thus reducing power and the amount of data needed for reading out the image data. The compression is a result of the non-linearity of the response of the image sensor with the avalanche diode photodetector pixels that are recharged in an asynchronous way.

Particularly, the bit width U of the counter unit may be set depending on a desired frame time so that the frame time corresponds to at least the product $(2^U-1)$ and the dead time $t_{dead}$, i.e. $(2^U-1)*t_{dead}$.

It may be provided that the frame time is set so that the dark counts which corresponds to the product of the dark count rate and the frame time is $\sqrt{DC}<1$ as to enable photon counting.

Furthermore, a global time-gating at the pixel level is provided, selectively enabling photon detection counting.

According to an embodiment the dead time may be set so that the characteristics of the count rate versus the light intensity is considerably non-linear. Although the characteristics is nonlinear throughout the counting range as the counting rate C depends on the photon detection rate $C_{real}$ (corresponding to the light intensity) by the factor $C=C_{real}/[1+t_{dead}*C_{real}]$. The dead time $t_{dead}$ can basically be set to any given value, but it will be preferred to set the dead time $t_{dead}$ that the ratio of the recorded counts in the pixel counter versus the number of photon detection events corresponding to the light intensity is lower than 0.9 preferably lower than 0.8 for more than 100, 200 or 300 photon detection events corresponding to the light intensity. Alternatively, the dead time $t_{dead}$ can be set to a value where the nonlinearity at a received average light intensity $C_{real\_average}$ average will be $1/[1+t_{dead}*C_{real}]>10\%$ preferably >20%. Particularly, the dead time is between 0.5 to 60 µs, preferably between 2 and 20 µs.

Furthermore, the dead time $t_{dead}$ can be selected so that it allows a signal to noise ratio decrease of less than −3 dB compared to the Poisson-limited SNR at the maximum photon counts $C_{max}$.

Moreover, a post-processing unit may be configured to retrieve counter values of all photodetector elements.

Further, the post-processing unit may be configured to decompress, particularly linearize, counter values of all photodetector elements independently or globally.

It may be provided, that the cell control unit of each photodetector element has an individually set dead time.

According to an embodiment, the post-processing unit is configured to linearize counter values of all photodetector elements independently or globally. Independent linearization is performed by using individually measured or set pixel dead times, whereas global linearization uses the average dead time.

The cell control unit of each photodetector element may be configured to variate the dead time depending on the light intensity.

It may be provided that the size of the counter unit is between 8 and 14 bits.

The counter unit may have two counters which are configured to allow an intermitting operation of counting and reading out.

Alternatively, the counter unit may have one counter and a latched memory which are configured to copy the counter value into the latched memory after a frame time while continuously counting photon detection events using the counter.

By means of any of these counter unit configurations, i.e. two intermittently operated counters or a counter and a latched memory for each photodetector element can be introduced to enable an almost 100% temporal aperture and global shutter.

Moreover, the resistance of the photodiode is set to between 500Ω and 1500Ω, preferable to between 800 and 1200Ω. Further, a serial resistance may be coupled with the photodiode to increase the resistance of the serially coupled photodiode and resistance to between 500Ω and 1500Ω, preferable to between 800 and 1200Ω.

According to a further aspect, a method for operating an image sensor is provided comprising a photodetector array including neighboring photodetector elements, wherein each photodetector element has a photodiode and a reset unit, wherein the photodiode is asynchronously reset after a given dead time after detection of a photon.

Moreover, a plurality of photon detection events in each photodetector element may be separately counted with a given frame time.

BRIEF DESCRIPTION OF THE DRAWINGS

Embodiments are described in more detail in conjunction with the accompanying drawings in which.

Figure 1:
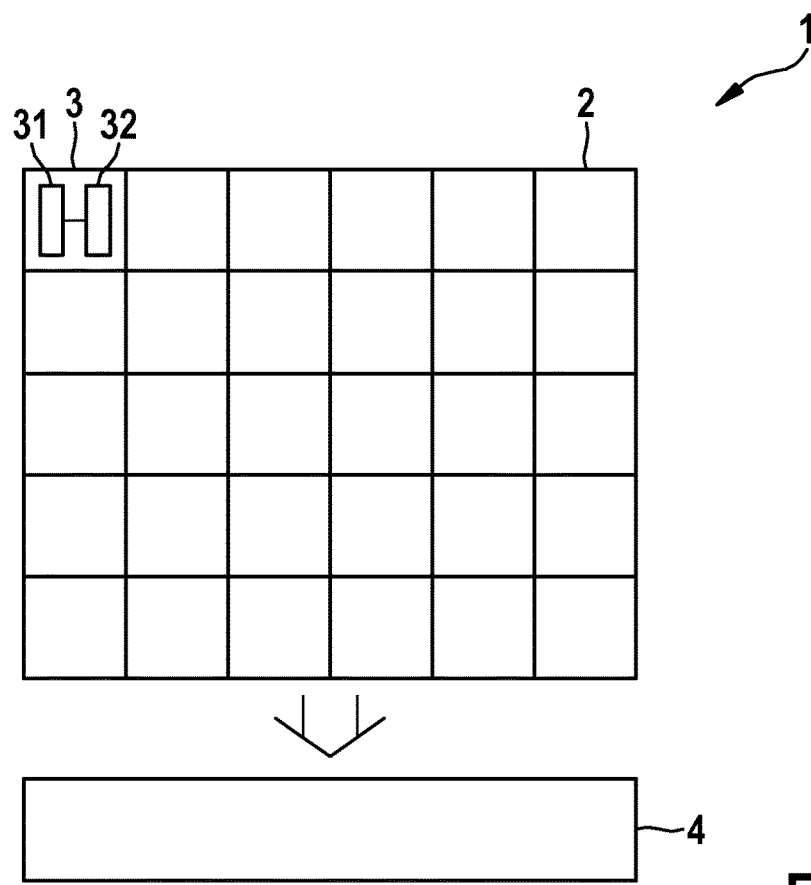
FIG. 1 schematically shows a block diagram of an image sensor having a photodetector array, each with a photodetector element associated with a read-out unit.

Corresponding reference characters indicate corresponding components throughout the several views of the drawings. Elements in the figures are illustrated for simplicity and clarity and have not necessarily been drawn to scale. The dimensions of some of the elements in the figures may be exaggerated relative to other elements to help to improve understanding of various embodiments of the present invention.

DESCRIPTION OF EMBODIMENTS

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any combinations and/or subcombinations in one or more embodiments or examples.

Particular features, structures or characteristics may be included in an integrated circuit, an electronic circuit, a combinational logic circuit, or other suitable components that provide the described functionality. In addition, the figures provided herewith are for explanation purposes to persons ordinarily skilled in the art and that the drawings are not necessarily drawn to scale.

Figure 2:
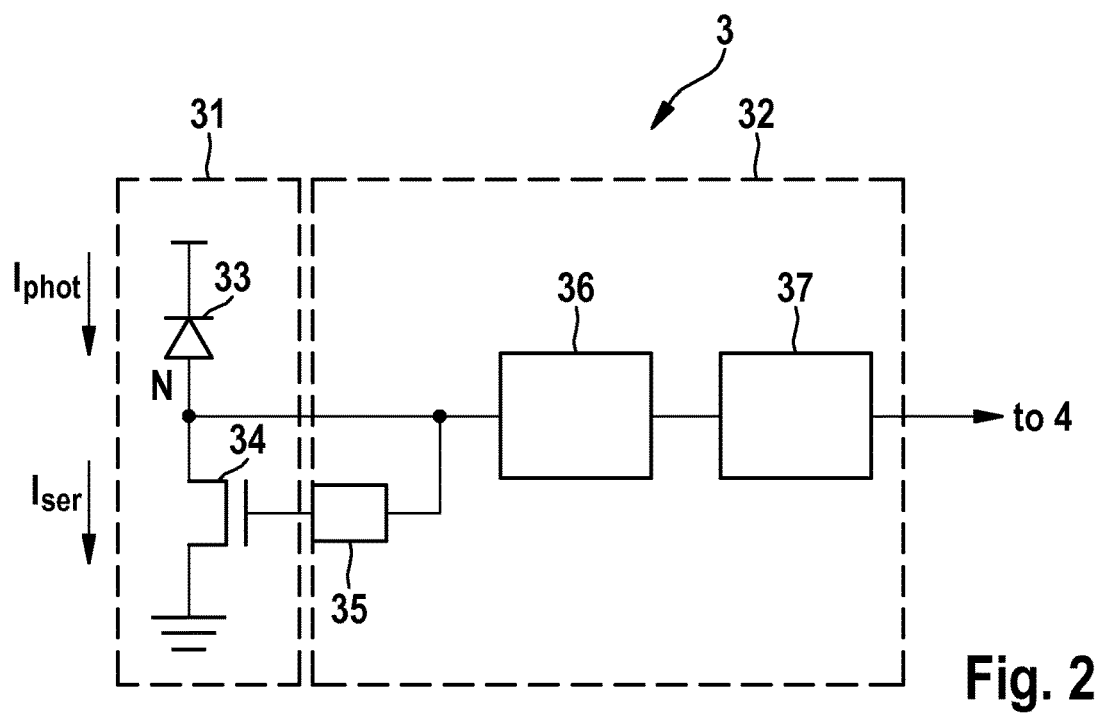
FIG. 2 is a more detailed diagram of a photodetector element including the associated read-out unit.

FIG. 1 schematically shows an image sensor 1 including a photodetector array 2 comprising neighboring photodetector elements 3. Each photodetector element 3 has a photodetector cell 31 and a cell control unit 32 coupled with the photodetector cell 31. The block diagram of FIG. 2 shows a photodetector element 3 in more detail wherein the photodetector cell 31 has a photodiode 33, which may be implemented as a single-photon avalanche diode as known in the art. The cell control unit 32 is configured to reset the photodiode 33 after a photon detection has been made. In case of the single-photon avalanche diode this can be performed by firstly quenching the electron avalanche followed by recharging the photodiode after a predetermined delay. Furthermore, the cell control unit 32 is configured to count photon detection events to be read out into a post-processing unit 4.

Figure 3:
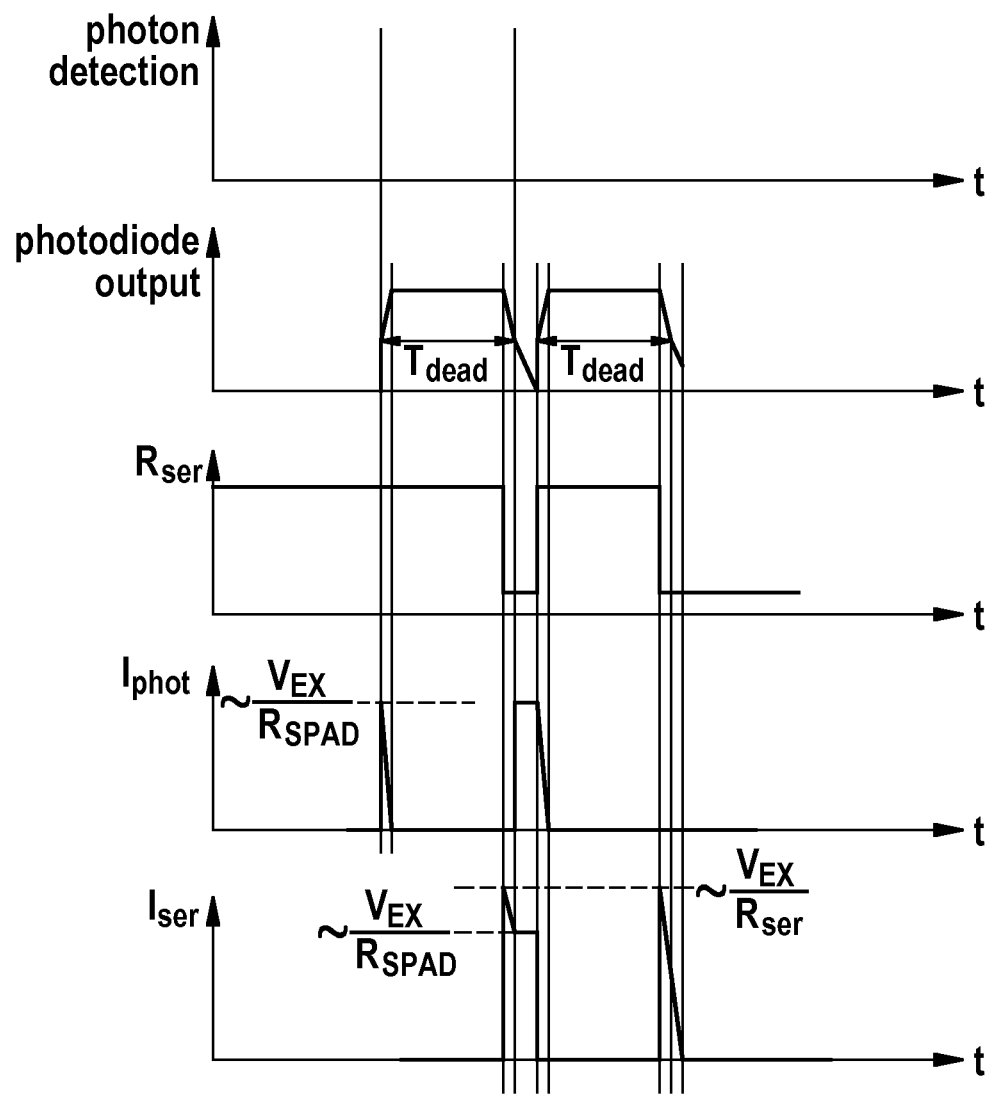
FIG. 3 is a signal-time-diagram for illustrating the operation of a photodetector element of the image sensor of FIG. 1.

The operation of a photodetector element 3 is further described in conjunction with the signal time diagram of FIG. 3.

Usually, a single-photon avalanche diode is configured to detect an impinging photon. The photon is caught in the semiconductor material of a p-n-junction of the photodiode 33 and generates an electron hole pair in the semiconductor. By means of an electrical field applied over the p-n-junction the negatively charged electron and the positively charged hole are separated and accelerated in different directions. Due to the electrical field the electron obtains kinetic energy and potentially collides so that new electron hole pairs are produced. This process generates an electron avalanche upon photodetection which is detectable by a characteristic current flow through the photodiode 33. Such so-called Geiger mode photodetection is able to generate a photon detection signal as an electrical pulse signal with an impinging photon.

The photodiode 33 of the photodetector cell 31 is connected in series with a reset unit which may contain at least one transistor 34. By means of the transistor the photodiode 33 can be biased above the breakdown voltage for a full operation. This may be accomplished by closing the recharge transistor 34 controlled by an active reset unit 35. The active reset unit 35 is coupled with a node N between the photodiode 33 and the recharge transistor 34 and triggered by a detection pulse on occurrence of a photon detection event.

The node N between the photodiode 33 and the recharge transistor 34 is coupled with a time-gate unit 36 of the cell control unit 32. The time-gate unit 36 serves as a gate to allow a pass-through of the photon detection signal or not. This can be controlled by an enable signal E. The photon detection signal pulses are forwarded to a counter unit 37 which has a depth of a number of U bits.

On activation of the photodetector cell 31 by an impinging photon (photon detection, first line of FIG. 3), the photodiode 33 generates a steady electrical pulse (photodiode output voltage, second line) which is fed through the time-gate unit 36. Within a dead time $t_{dead}$ the photodiode 33 is quenched and recharged, so that the photodetector cell 31 is ready to detect a further photon. The dead time $t_{dead}$ determined and set by the active reset unit 35. For recharging is the recharge transistor 34 is closed as can be seen by the time diagram of the source-drain-resistance Rser (third line). The fourth line of the diagram shows the characteristics of the photodiode current $I_{phot}$ through the photodiode 33 and the fifth line shows the characteristics of the recharge current $I_{ser}$ through the recharge transistor 34.

In the asynchronous mode, the photon detection triggers the active reset unit 35 to start the recharging process so that after expiry of the dead time $t_{dead}$, the recharge transistor 34 has been controlled to reduce its resistance so that the photodiode 33 is coupled to a ground potential and the electrical field over the p-n-junction of the photodiode 33 has been set up.

In conjunction with the signal-time diagram of FIG. 3, the operation of the photodetector cell 31 is described as follows. If a photon is received by the recharged photodiode 33, the resulting electron avalanche will be detected at the terminal (node N) of the photodiode 33 and the photodiode current $I_{phot}$ increases.

After detection the voltage over the photodiode 33 will be reduced to quench the avalanche so that no further electron-hole pairs are generated. Therefore, the photodiode current $I_{phot}$ drops immediately after the detection has been made. The active reset unit 35 triggers the recharge transistor 34 accordingly to have a low resistance shortly before the lapse of a predetermined dead time $t_{dead}$ during which the photodiode 33 will not be charged and therefore cannot detect/signal any photon detection event.

Shortly before lapse of the dead time $t_{dead}$, the electrical field of the photodiode 33 is recharged by closing the recharge transistor 34 to allow the detection of the next photon by the photodetector cell 31. The recharge current $I_{ser}$ flow is indicated by the rise of the recharge current shortly before the end of the dead time $t_{dead}$. The recharge current $I_{ser}$ drops immediately after a photon detection event as after the quenching occurs within the dead time $t_{dead}$.

The photon detection signal which is allowed to pass through the time-gate unit 36 increments the counter unit 37 so that the count of photon detection events within a given frame time $t_{frame}$ which substantially is selected depending on the bit-depth U of the counter unit 37 and the duration of the dead time $t_{dead}$ such that $t_{frame} \geq (2^U - 1) \cdot t_{dead}$.

The dead time $t_{dead}$ may be set by the cell control units 32 of each photodetector element 3 has an individually set dead time.

Furthermore, the cell control unit 32 of each photodetector element 3 is configured to variate the dead time depending on the light intensity. The light intensity can be initially or regularly measured by setting the dead time to a very low value, such as 0 or the lowest technically possible value (just circuitry intrinsic delays), thereby linearizing the detection characteristics on the level of the photodetector element 3. This measured light intensity can be used to set the dead time globally, i.e. for each of the photodetector elements 3, or for each photodetector element individually or groupwise. Light intensity can be measured by variating the dead time to a low level after periods of a given multiple of the frame times or given period of times.

Basically, for configuring the photodetector element 3, it is started with a given frame time 5 ms to about 15 ms corresponding to frame rates of 60 to 200 fps. Such frame rates are conventionally preferred but can be selected to be higher or lower as well. For special applications frame rates of more than 1 kfps can be selected.

U may be selected in such a way that it enables a maximum signal-to-noise ratio above a defined value of the signal-to-noise ratio such as 30 dB which is typical for image sensors with counter sizes of 10 bits: $20 \log_{10}(\sqrt{1023})$). Possible counter sizes may be 8 to 14 bits, preferable 10 to 12 bits. Furthermore, the counter size U may be set so that U+C(U) bits fulfill the dynamic range requirement wherein C(U) corresponds to the compression bits used to indicate the light intensity value after decompression (compensation of non-linearity).

Figure 7:
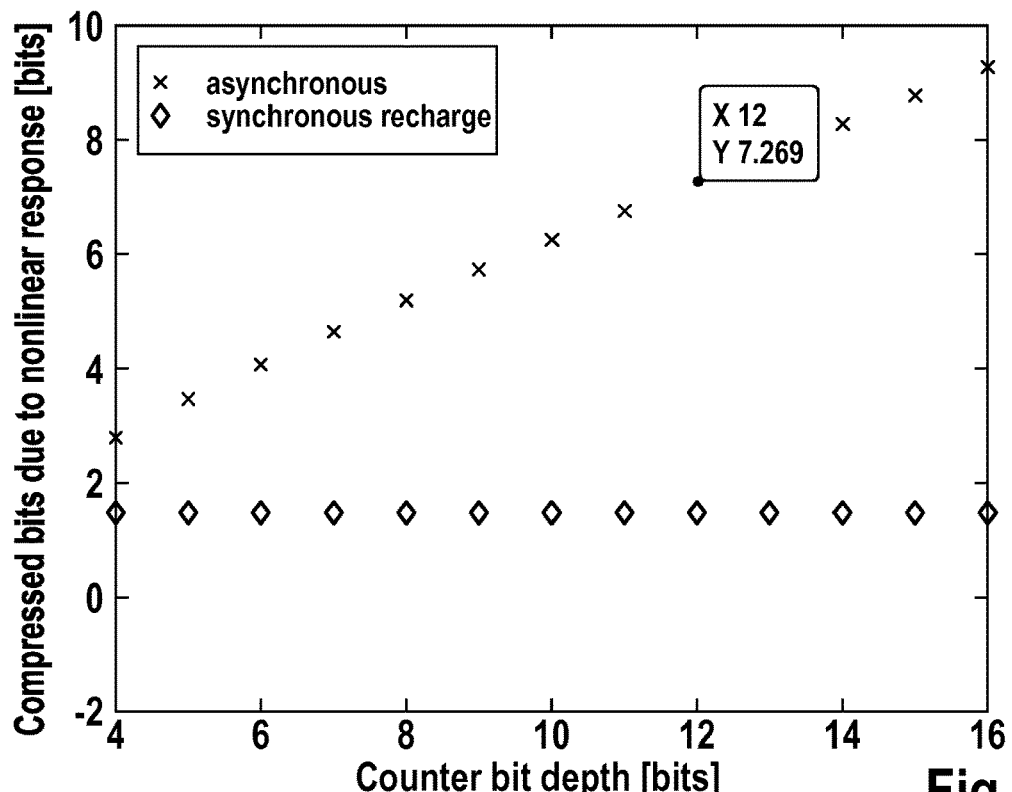
FIG. 7 shows a diagram illustrating how many bits can be recovered with a maximum signal to noise degradation of 1/sqrt(2), if one uses U bit counters, where $2^U-1=Cmax$, for the asynchronous (event-drive) and synchronous (clock-driven) recharge scheme depending on the counter size (in bits).

FIG. 7 shows a diagram illustrating how many bits C(U) can be recovered with a maximum signal to noise degradation of $1/\sqrt{2}$, if one uses U bit counters, where $2^U - 1 = Cmax$, for the asynchronous (event-driven) and synchronous (clock-driven) recharge scheme. Substantially it can be seen the compression factors for different counter bit depths, limited by a signal to noise ratio decrease to $\sqrt{Cmax}/\sqrt{2}$. Event-driven recharge has a clear advantage. For example, with 12 bit counters (U=12), one can add 7 bits (C=7 for compression) after data linearization (decompression). These 7 bits are compressed directly at the pixel level, reducing the power consumption and data rate dramatically. In the example with U=12 and C(U)=7, the maximum power consumption of the photodetector element 3 is reduced from $2^{19}*P$ to $2^{12}*P$, wherein P corresponds to the power consumed due to the photon detection, because of the reduced photon count switching. This yields a power decrease of a factor of $2^7$. Additionally, the decompression allows for a high dynamic range imaging with 19 bits while maintaining the photon counting ability of single photon avalanche diode pixels.

For a 12 bit counter frame times of 5 ms to about 15 ms would result in a maximum dead time $t_{dead} = t_{frame}/(2^U - 1)$ of between 1 μs and 3 μs. Particularly, the dead time $t_{dead}$ may be set so that it reduces the power below a defined value and/or is decreased so that it enables a maximum SNR above the defined value of 30 dB. For frame rates in the range of 1 kfps dead times of 0.1 to 0.5 μs would be applicable as well.

The dead time $t_{dead}$ may be selected (prolonged) to have a low power consumption while forcing the photodetector cell 31 to operate in a non-linear mode.

Figure 4:
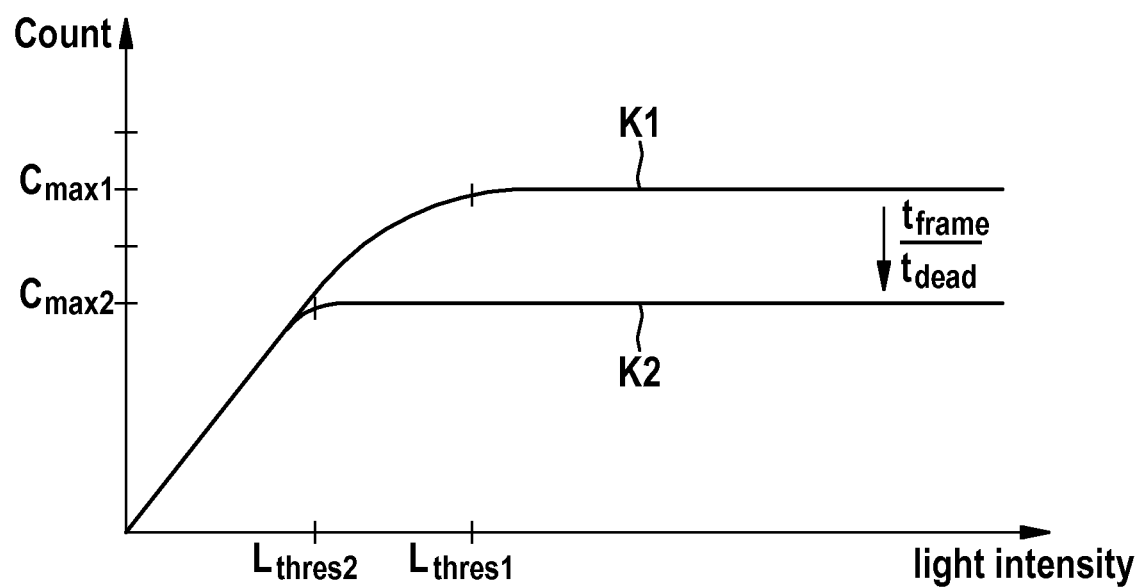
FIG. 4 is an illustration of the effect of an increased dead time onto the characteristics of the intensity counter over light intensity.

The non-linear mode is determined by the effect that not all photons arriving at a photodetector cell 31 will lead to a corresponding signal which is counted in the counter unit 37. Substantially, the characteristics of the count are indicated in the diagram of FIG. 4 which shows the resulting count value C for a selected pixel (photodetector element) over the intensity L of the light exposure and the effect of the duration of the dead time $t_{dead}$ on the resulting curve. In general, for lower light intensities the count value is substantially linear to the light intensity, while starting with a threshold light intensity $L_{thres}$, the curve flattens to be non-linear and to asymptotically approach to a maximum count value Cmax.

Basically, a conventional SPAD image sensor has an inappropriately high power consumption. For instance, the photodiode output load capacitor has a capacitance 10 fF, and an output swing of 3 V. For a frame rate of 60 fps with a 20 bit counter and a maximum counter rate of 60 MHz, the corresponding current would be 1.8 μA per photodiode. Assuming further that a photodiode operates at 20V, the maximum power would be 36 μW per pixel. Thus, for a 1 megapixel image sensor, the corresponding power consumption would be 36 W, which would be unacceptably large for general purpose devices.

The dead time $t_{dead}$ substantially affects the frequency the photodiode 33 is recharged so that due to a lower frequency of the transient currents through the photodiode 33 during photon detection the power consumption can be reduced. The power consumption of recharging is dominant so that by reducing the frequency of recharging a substantial reduction of the power consumption can be achieved. Furthermore, the recharge voltage (pixel bias) may be gradually reduced with increasing counter value due to light detection.

Figure 8:
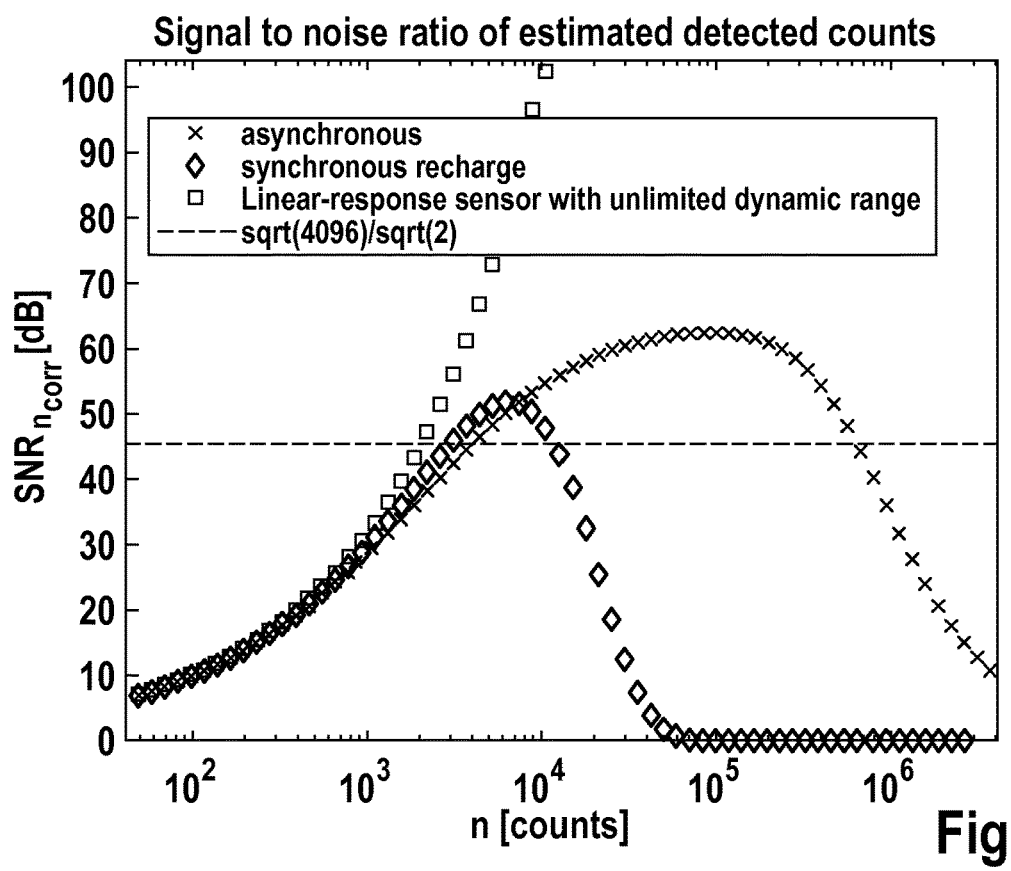
FIG. 8 shows the maximum achievable signal to noise ratio.

As can be seen in FIG. 8, the maximum achievable signal to noise ratio would be around $\sim\sqrt{2^U - 1}$. Substantially shown is the signal to noise ratio of the decompressed data or the linearized photon count number for an asynchronous and cock driven recharge mechanism. The maximum (Poisson limited) signal to noise ratio which one can achieve in light detection is $\sqrt{N}$, where N is the number of detected photons. In the exemplary case of a 12 bit counter unit, the maximum signal to noise ratio is limited to $\sqrt{4096}=64$. One needs to define a maximally acceptable signal to noise ratio degradation due to the nonlinear response, and here it can be exemplarily selected to limit this degradation to $\times 1\sqrt{2}$, i.e. $\sqrt{4096}/\sqrt{2}=45.25$. The dashed line presents the maximum relative degradation of the signal to noise ratio.

FIG. 8 shows the signal to noise ration of the decompressed data (decompression in the post-processing unit 4 after reading out of the counter value) or the linearized photon count number) differences of the two recharge mechanisms (asynchronous and synchronous). However, one can set a different value for the minimal SNR and calculate the compression factor.

As can be seen that for a photodetector element 3 with a lower dead time $t_{dead1}$ (curve K1), the light intensity threshold $L_{thres1}$ and the maximum count value $C_{max1}$ will be higher than for a photodetector element 3 with a higher dead time $t_{dead2}$ (curve K2), Here the light intensity threshold $L_{thres2}$ and the maximum count value $C_{max2}$ of curve K2 will be lower. Increasing the dead time $t_{dead}$ causes the light intensity threshold $L_{thres}$ to move to lower light intensities so that for a broader range of possible light intensities, the photodetector cell 31 operates in a non-linear mode.

In the post-processing unit 4, the operation of the photodetector cells 31 in the non-linear mode is decompressed by multiplying the count value with a correction factor which allows to reproduce the correct light intensity received by the respective photodetector cell 31. The correction factor is calculated depending on the dead time $t_{dead}$. Thereby, the photon count can be linearized again for the photon count of each photodetector element 3. Linearization can also be performed globally on the basis of an average dead time of all photodetector elements 3 or of equal dead times.

As the not counted photon detection events can be compensated by the correction factor a reduction of power consumption can be obtained without a substantial information loss regarding the light intensity for each pixel.

Due to the increased dead time, the photodiode 33 tends to operate in a non-linear regime. This results in decreased switching frequency and less quenching and recharging cycles and thereby in a lower power consumption. Consequently, the dead time $t_{dead}$ can be increased so that the power consumption of the photodetector cell 31 is reduced below a defined value.

Photon detection events during recharging so that recharging and detection occur simultaneously are more probable if the photodiode 33 operates in the highly non-linear regime. In this case, an avalanche will be started, but it will not be quenched immediately, but at a delayed time. Such events may increase the power consumption. To reduce the power consumption of such events, the internal or external serial resistance of the photodiode could be increased to reduce the current $V_{EX}/R_{SPAD}$. By setting the internal resistance of the photodiode 33 to between 500Ω and 1500Ω, preferable to between 800 and 1200Ω. The increase of the resistance of the photodiode 33 can also be achieved by providing a serial resistance with the photodiode. The increased resistance of the photodiode 33 will increase the recharge time (time necessary for recharging the photodiode) however, due to the increased dead time this may have no effect on the operation of the photodetector element 3.

Furthermore, the frame time $t_{frame}$ can be selected so that the dark counts DC which corresponds to the product of the dark count rate and the frame time $t_{frame}$ satisfies $\sqrt{DC}<1$ to enable photon-counting granularity. The dark count rate corresponds to the rate of occurrence of electron-hole avalanches without the trigger of a photon (no impinging photon) due to impurities of the semiconductor, radioactivity and the like. The dark count rate is an intrinsic material property which can be reduced by reducing the size of the photodetector cell 31, by further annealing process steps and/or by a design optimization of the photodetector cell 31.

The above image sensor design allows to reduce the power consumption of a photodetector array 2 using avalanche photodiodes and operated in an asynchronous operation while the dynamic range and the signal-to-noise ratio is not substantially affected. The reduction of the power consumption is substantially caused by increasing the dead time. Hence, in combination with an increase dead time, the light responses in the signal-to-noise ratio is not degraded as might be expected from previous studies. Substantially, the combination of the asynchronous (event-driven) recharge and the larger dead time pixel-wise provides a great benefit for the reduction of the power consumption.

Figure 5:
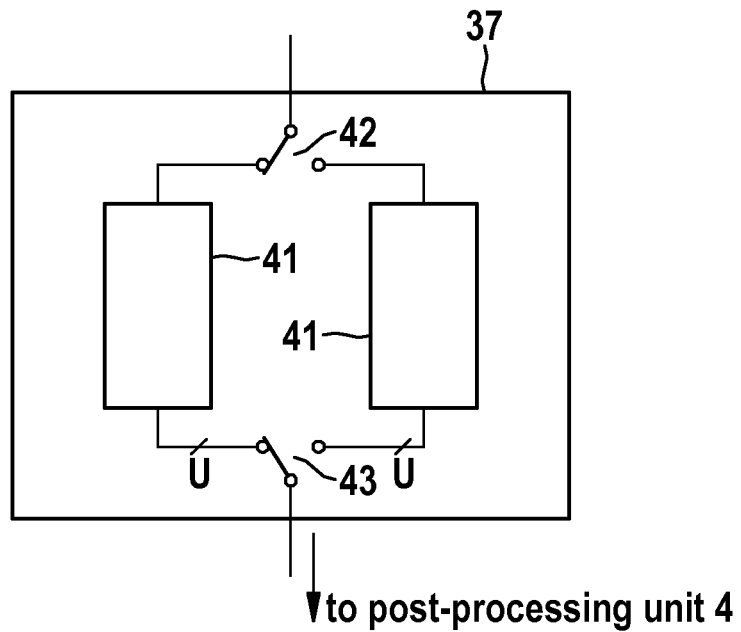
FIG. 5 shows a configuration of the counter unit of the photodetector element of FIG. 2.
Figure 5:
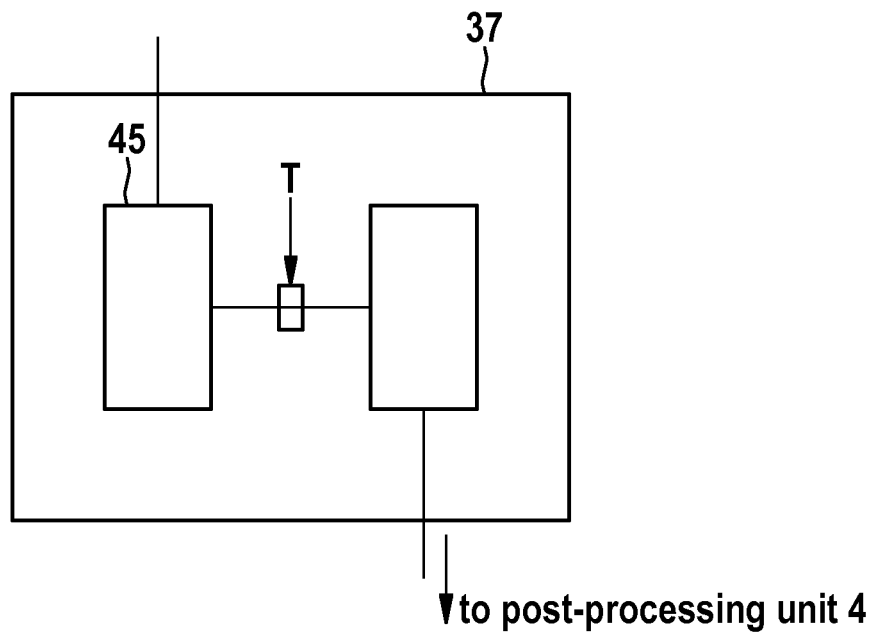

As shown in FIG. 5a, the counter unit 37 can be provided with two counters 41 configured to allow an intermitting read out-operation. By means of a trigger switch 42 the counter 41 to be incremented by photon detection events can be selected and by means of a read-out-switch 43 the counter to be read-out after the lapse frame time can be selected. At the time the counter 41 is selected for reading out the trigger switch 42 is controlled to select the other counter 41 for continuing the incrementation on photon detection events. This allows to increase the data rate for reading-out the counter value which corresponds to the light intensity. Thereby, the counter unit 37 can be separated into two counters to provide an intermitting operation so that reading out and writing onto the counter unit 37 can be performed intermittently to increase the read-out data rate.

Furthermore, as shown in FIG. 5b, the counter unit 37 may have one counter 45 and a latched memory 46 which are configured to copy the counter value into the latched memory 46 depending on a trigger signal T after a frame time. The counter 45 may be reset at the same time and continue to count photon detection events.

By means of above configuration of FIG. 5b, the temporal aperture will be slightly reduced compared to the configuration of FIG. 5a, but the per-pixel time-gate can be used for global exposure.

Figure 6:
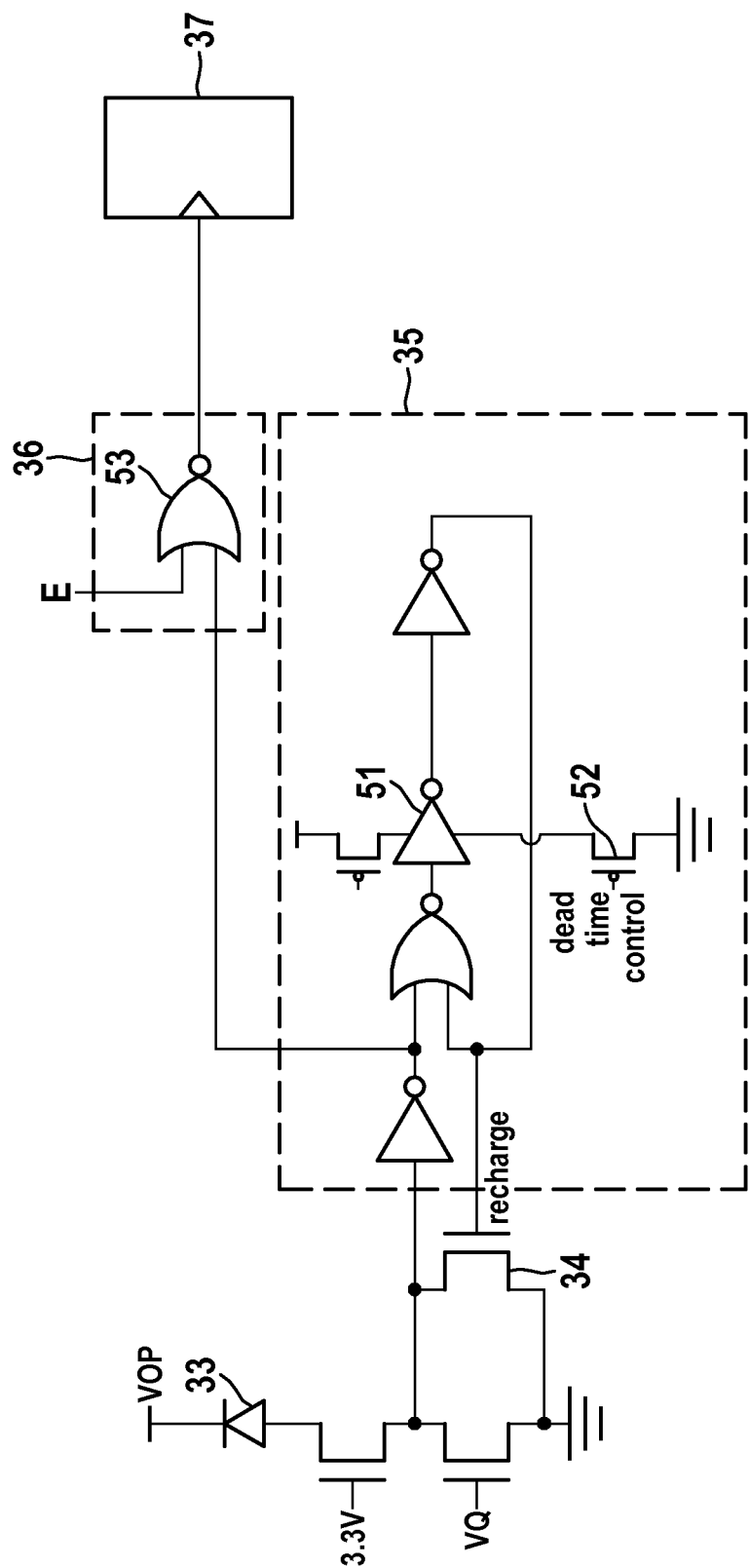
FIG. 6 is a detailed schematic of the photodetector element.

In FIG. 6 a more detailed schematic of a photodetector element 3 is depicted, the reset unit 35 and the time-gate unit 36 are fully implemented using CMOS logic. Using a driver 51 the dead time can be controlled by controlling its supply voltage by means of a hold-off control transistor 52 to be controlled by a dead time control signal.

The time-gate unit 36 may be implemented by a NOR-gate 53 to allow active operation of the photodetector element 3 based on the enable signal E, which is defined active when at logical 0.

The invention claimed is:

1. An image sensor comprising a photodetector array including neighboring photodetector elements, each photodetector element comprising:
   a photodetector cell with a photodiode and a reset unit;
   a cell control unit coupled with the photodetector cell and configured to reset the photodiode by means of the reset unit;
wherein the cell control unit is configured to asynchronously effect resetting of the photodiode after a given dead time after detection of a photon,
wherein a post-processing unit is configured to retrieve counter values of all photodetector elements,
wherein the post-processing unit is configured to linearize counter values of all photodetector elements independently or globally.

2. The image sensor according to claim 1, wherein the photodiode of each photodetector element comprises an avalanche photodiode, such as a single-photon avalanche diode.

3. The image sensor according to claim 2, wherein the resetting of the avalanche photodiode is performed by recharging an electrical field in the photodiode.

4. The image sensor according to claim 1, wherein the cell control unit is configured to asynchronously effect resetting of the photodiode exactly with a delay of the given dead time after detection of the photon.

5. The image sensor according to claim 1, wherein a counter unit is configured to count photon detection events in the photodiode during a given frame time.

6. The image sensor according to claim 5, wherein the bit width U of the counter unit is set depending on frame time so that the frame time corresponds to at least the product $(2^U-1)$ and the dead time.

7. The image sensor according to claim 5, wherein the frame time is set so that the dark counts (DC) which correspond to the product of the dark count rate and the frame time is $\sqrt{DC}<1$, as to enable photon counting.

8. The image sensor according to claim 1, having global time-gating at the pixel level, selectively enabling photon detection counting.

9. The image sensor according to claim 1, wherein the dead time is set so that the ratio of the recorded counts in the pixel counter versus the number of photon detection events corresponding to the light intensity is lower than 0.9 preferably lower than 0.8 for more than 100 photon detection events, particularly for more than 200 photon detection events, corresponding to the light intensity.

10. The image sensor according to claim 1, wherein the post-processing unit is configured to decompress, particularly linearize, counter values of all photodetector elements independently or globally.

11. The image sensor according to claim 1, wherein the cell control unit of each photodetector element has an individually set dead time.

12. The image sensor according to claim 1, wherein the cell control unit of each photodetector element is configured to variate the dead time depending on the light intensity.

13. The image sensor according to claim 1, wherein the size of the counter unit is between 8 and 14 bits.

14. The image sensor according to claim 1, wherein the dead time is between 0.5 to 60 µs, preferably between 2 and 20 µs.

15. The image sensor according to claim 1, wherein the counter unit has two counters which are configured to allow an intermitting operation of counting and reading out.

16. The image sensor according to claim 1, wherein the counter unit has one counter and a latched memory which are configured to copy the counter value into the latched memory after a frame time while continuously counting photon detection events using the counter.

17. The image sensor according to claim 1, wherein the resistance of the photodiode is set to between 500 Ω and 1500Ω, preferable to between 800 and 1200 Ω.

18. The image sensor according to claim 17, wherein a serial resistance is coupled with the photodiode to increase the resistance of the photodiode to between 500Ω and 1500Ω, preferable to between 800 and 1200 Ω.

19. A method for operating an image sensor comprising a photodetector array including neighboring photodetector elements, wherein each photodetector element has a photodiode and a reset unit, wherein the photodiode is asynchronously reset after a given dead time after detection of a photon;

wherein a post-processing unit retrieves counter values of all photodetector elements and linearizes counter values of all photodetector elements independently or globally.

20. The method according to claim 19, wherein a plurality of photon detection events in each photodetector element are separately counted with a given frame time.

* * * * *